US010294399B2

(12) United States Patent
Ivanov et al.

(10) Patent No.: US 10,294,399 B2
(45) Date of Patent: May 21, 2019

(54) COMPOSITION AND METHOD FOR POLISHING SILICON CARBIDE

(71) Applicant: Cabot Microelectronics Corporation, Aurora, IL (US)

(72) Inventors: Roman Ivanov, Aurora, IL (US); Fernando Hung Low, Aurora, IL (US); Cheng-Yuan Ko, New Taipei (TW); Glenn Whitener, Batavia, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 50 days.

(21) Appl. No.: 15/398,933

(22) Filed: Jan. 5, 2017

(65) Prior Publication Data

US 2018/0190506 A1 Jul. 5, 2018

(51) Int. Cl.

| | |
|---|---|
| ***H01L 21/321*** | (2006.01) |
| ***C09G 1/02*** | (2006.01) |
| ***C09K 3/14*** | (2006.01) |
| ***H01L 21/306*** | (2006.01) |
| ***H01L 21/3105*** | (2006.01) |

(52) U.S. Cl.

CPC .............. *C09K 3/1409* (2013.01); *C09G 1/02* (2013.01); *C09K 3/1463* (2013.01); *H01L 21/31053* (2013.01)

(58) Field of Classification Search

None

See application file for complete search history.

(56) References Cited

U.S. PATENT DOCUMENTS 5,876,490 A 3/1999 Ronay
6,491,837 B1 * 12/2002 Liu .......................... C09G 1/02 216/100
6,776,810 B1 * 8/2004 Cherian ................ B24B 37/044 106/3
6,964,923 B1 11/2005 Ronay
8,247,328 B2 * 8/2012 White ...................... C09G 1/02 216/88
8,999,193 B2 * 4/2015 Shi .................... H01L 21/30625 216/89
9,548,211 B2 * 1/2017 Ward ....................... C09G 1/02
9,558,959 B2 * 1/2017 Mishra ..................... C09G 1/02
2003/0124959 A1 * 7/2003 Schroeder ................ C09G 1/02 451/41
2003/0211815 A1 * 11/2003 Carter ................. B24B 37/0056 451/41
2003/0228763 A1 * 12/2003 Schroeder ........... H01L 21/3212 438/691
2004/0014400 A1 * 1/2004 Cherian ................... C09G 1/02 451/41
2005/0076581 A1 4/2005 Small et al.
2008/0057713 A1 3/2008 Desai et al.
2008/0153292 A1 * 6/2008 White ...................... C09G 1/02 438/692
2010/0144149 A1 * 6/2010 Ward ....................... C09G 1/02 438/693
2010/0248479 A1 * 9/2010 McDevitt ................. C09G 1/02 438/693
2011/0240594 A1 * 10/2011 Hamaguchi .......... G11B 5/8404 216/22
2012/0003901 A1 * 1/2012 Hu .......................... C09G 1/02 451/36
2013/0005219 A1 1/2013 Takemura et al.
2013/0146804 A1 6/2013 Mizuno et al.
2014/0099790 A1 4/2014 Shi et al.
2014/0110626 A1 4/2014 Shi et al.
2015/0114928 A1 * 4/2015 Chu ......................... C09G 1/02 216/53
2015/0132955 A1 5/2015 Yamato et al.
2015/0197669 A1 * 7/2015 Palanisamy Chinnathambi .......... C09G 1/02 216/22
2015/0284593 A1 * 10/2015 Wang ....................... C09G 1/02 438/693
2015/0344739 A1 * 12/2015 Kamei .................. B24B 37/044 252/79.1
2016/0060487 A1 * 3/2016 Kraft ........................ C09G 1/02 451/36
2016/0222254 A1 * 8/2016 Huang ..................... C09D 1/02
2016/0244639 A1 * 8/2016 Li ..................... H01L 21/30625
2016/0358790 A1 * 12/2016 Shi ...................... H01L 21/3212

FOREIGN PATENT DOCUMENTS

EP 2662427 A2 11/2013

* cited by examiner

*Primary Examiner* — Allan W. Olsen

(74) *Attorney, Agent, or Firm* — Thomas Omholt; Erika S. Wilson; Francis J. Koszyk

(57) ABSTRACT

The invention provides a chemical-mechanical polishing composition comprising (a) silica particles, (b) a polymer comprising sulfonic acid monomeric units, (c) optionally, a buffering agent, and (d) water, wherein the polishing composition has a pH of about 2 to about 5. The invention further provides a method of chemically-mechanically polishing a substrate with the inventive chemical-mechanical polishing composition. Typically, the substrate comprises silicon carbide and silicon nitride.

8 Claims, No Drawings

COMPOSITION AND METHOD FOR POLISHING SILICON CARBIDE

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

The next generation of semiconductor devices incorporates the use of materials with greater hardness and other desirable properties for high power, high temperature, and high frequency operation applications. Such materials include silicon carbide and silicon nitride. Silicon carbide is a material with a desirable combination of electrical and thermo-physical properties, including high practical operating temperature, good corrosion resistance, and high thermal properties. Silicon nitride is a high strength hard material having utility as an etch stop mask, an electrical insulator, a chemical diffusion barrier, or as a dielectric material in capacitors. However, silicon carbide and silicon nitride are significantly harder and more chemically inert than other materials comprising integrated circuits.

In addition, known polishing compositions and methods do not provide the ability to selectively remove silicon carbide from a semiconductor wafer without removing materials such as silicon dioxide from the same wafer at unacceptably high levels. As the technology for integrated circuit devices advances, traditional materials are being used in new and different ways to achieve the level of performance needed for advanced integrated circuits. In particular, silicon nitride, silicon carbide, and silicon dioxide are being used in various combinations to achieve new and even more complex device configurations. In general, the structural complexity and performance characteristics vary across different applications.

Accordingly, there is an ongoing need to develop new polishing methods and compositions that provide relatively high rates of removal of silicon carbide and to selectively remove silicon carbide in preference to other materials present on the surface of the semiconductor wafer.

BRIEF SUMMARY OF THE INVENTION

The invention provides a method of chemically mechanically polishing a substrate comprising (i) providing a substrate, wherein the substrate comprises a silicon carbide layer on a surface of the substrate; (ii) providing a polishing pad; (iii) providing a polishing composition comprising (a) silica particles, (b) a polymer comprising sulfonic acid monomeric units, and (c) water, wherein the polishing composition has a pH of about 2 to about 5; (iv) contacting the substrate with the polishing pad and the polishing composition; and (v) moving the polishing pad and the polishing composition relative to the substrate to abrade at least a portion of the silicon carbide layer on a surface of the substrate to polish the substrate.

The invention also provides a chemical-mechanical polishing composition comprising (a) silica particles containing aluminum ions, wherein the aluminum ions are uniformly distributed within the silica particles, and wherein the silica particles have an average particle size of about 40 nm to about 80 nm, (b) a polymer comprising sulfonic acid monomeric units, (c) a buffering agent, and (d) water, wherein the polishing composition has a pH of about 2 to about 5.

DETAILED DESCRIPTION OF THE INVENTION

The invention provides a chemical-mechanical polishing composition comprising (a) silica particles, (b) a polymer comprising sulfonic acid monomeric units, (c) optionally, a buffering agent, and (d) water, wherein the polishing composition has a pH of about 2 to about 5.

The polishing composition comprises silica particles. The silica particles can be any suitable silica particles. The silica particles can be precipitated silica particles or condensation-polymerized silica particles. In some embodiments, the silica particles comprise precipitated silica, such as Snowtex™ silica particles from Nissan Chemical. Non-limiting examples of Snowtex™ silica particles include the ST-OL-40, ST-OZL-35, and ST-PMSO products. In some embodiments, the silica particles comprise anionic silica particles prepared by condensation of silica particles with a mercaptosilane such as a mercaptoalkyltrialkoxysilane, followed by oxidation of the mercaptan group to sulfate or sulfonate. Non-limiting examples of suitable anionic silica particles are the PL-3D from Fuso Chemical and WL 83A, a colloidal silica particle that has been surface modified with aluminum ions, as described in U.S Published Application 2016/0222254. In some embodiments, the silica particles contain aluminum ions, wherein the aluminum ions are uniformly distributed within the silica particles. Silica particles containing aluminum ions can be prepared by a precipitation process using an aqueous silicate solution containing aluminum ions. The aluminum ions can be added to the aqueous silicate solution, or can occur as impurities or low level components of the silicate resulting from the raw materials used to prepare the silicate. In this embodiment, because the particles are formed from a homogeneous solution, the aluminum ions are uniformly distributed through the silica particles. This is distinct from aluminum doping of silica particles, wherein already formed silica particles are contacted with a solution containing aluminum ions such that the aluminum ions become associated with the surface of the silica particles. A non-limiting example of suitable silica particles containing aluminum ions is the TX13573 product from Nalco.

The silica particles can have any suitable average particle size (i.e., average particle diameter). For spherical silica particles, the size of the particle is the diameter of the particle. For non-spherical silica particles, the size of the particle is the diameter of the smallest sphere that encompasses the particle. The particle size of the silica can be measured using any suitable technique, for example, using laser diffraction techniques. Suitable particle size measurement instruments are available from, for example, Malvern Instruments (Malvern, UK). If the average silica particle size is too small, the polishing composition may not exhibit sufficient removal rate. In contrast, if the average silica particle size is too large, the polishing composition may exhibit undesirable polishing performance such as, for example, poor substrate defectivity.

Accordingly, the silica particles can have an average particle size of about 40 nm or more, for example, about 45 nm or more, or about 50 nm or more. Alternatively, or in addition, the silica particles can have an average particle size of about 80 nm or less, for example, about 75 nm or less, about 70 nm or less, about 65 nm or less, or about 60 nm or less. Thus, the silica particles can have an average particle size bounded by any two of the aforementioned endpoints. For example, the silica particles can have an average particle size of about 40 nm to about 80 nm, about 40 nm to about 75 nm, about 40 nm to about 70 nm, about 40 nm to about 65 nm, about 40 nm to about 60 nm, about 45 nm to about 80 nm, about 45 nm to about 75 nm, about 45 nm to about 70 nm, about 45 nm to about 65 nm, about 45 nm to about 60 nm, about 50 nm to about 80 nm, about 50 nm to about 75 nm, about 50 nm to about 70 nm, about 50 nm to about 65 nm, or about 50 nm to about 60 nm.

The silica particles preferably are colloidally stable in the inventive polishing composition. The term colloid refers to the suspension of silica particles in the liquid carrier (e.g., water). Colloidal stability refers to the maintenance of that suspension through time. In the context of this invention, silica particles are considered colloidally stable if, when the silica particles are placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of silica particles in the composition ([C] in terms of g/mL) is less than or equal to 0.5 (i.e., $\{[B]-[T]\}/[C]\leq 0.5$). More preferably, the value of $[B]-[T]/[C]$ is less than or equal to 0.3, and most preferably is less than or equal to 0.1.

The polishing composition can comprise any suitable amount of silica particles. If the polishing composition of the invention comprises too little silica, the composition may not exhibit a sufficient removal rate. In contrast, if the polishing composition comprises too much silica, then the polishing composition may exhibit undesirable polishing performance, may not be cost effective, and/or may lack stability. The polishing composition can comprise about 10 wt. % or less of silica particles, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less of silica particles. Alternatively, or in addition, the polishing composition can comprise about 0.05 wt. % or more of silica particles, for example, about 0.1 wt. % or more, about 0.2 wt. % or more, about 0.3 wt. % or more, about 0.4 wt. % or more, about 0.5 wt. % or more, or about 1 wt. % or more of silica particles. Thus, the polishing composition can comprise silica particles in an amount bounded by any two of the aforementioned endpoints. For example, the polishing composition can comprise about 0.05 wt. % to about 10 wt. % of silica particles, for example, 0.1 wt. % to about 10 wt. %, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. %, about 0.1 wt. % to about 4 wt. %, about 0.1 wt. % to about 3 wt. %, about 0.1 wt. % to about 2 wt. %, about 0.1 wt. % to about 1 wt. %, about 0.2 wt. % to about 2 wt. %, about 0.2 wt. % to about 1 wt. %, about 0.2 wt. % to about 0.6 wt. %, or about 0.3 wt. % to about 0.5 wt. % of silica particles. In an embodiment, the polishing composition comprises about 0.5 wt. % to about 3 wt. % of silica particles (e.g., about 1 wt. % to about 3 wt. % of silica particles, or about 1 wt. % to about 2 wt. % of silica particles).

The polishing composition comprises a polymer comprising sulfonic acid monomeric units, referred to hereinafter as a sulfonic acid polymer or copolymer. The sulfonic acid monomeric units can be any suitable sulfonic acid monomeric units comprising one or more groups of the formula: —$SO_3H$. Non-limiting examples of suitable sulfonic acid (homo)polymers include polyvinylsulfonic acid, polystyrenesulfonic acid (e.g., poly(4-styrenesulfonic acid)), polyallylsulfonic acid, poly ethyl acrylate sulfonic acid, poly butyl acrylate sulfonic acid, poly isoprenesulfonic acid, and the like. Suitable sulfonic acid copolymers include copolymers comprising sulfonic acid monomeric units and monomers comprising carboxylic acid groups or derivatives of carboxylic acid groups such as amides. Non-limiting examples of suitable sulfonic acid copolymers include poly(2-acrylamide-2-methylpropanesulfonic acid), poly(4-styrenesulfonic acid-co-maleic acid), and the like. In a preferred embodiment, the sulfonic acid polymer is polystyrenesulfonic acid. The sulfonic acid polymer can be provided in its free acid form, as a salt thereof, or as a partial salt thereof.

The sulfonic acid polymer or copolymer can have any suitable molecular weight. The sulfonic acid polymer or copolymer can have an average molecular weight of about 50,000 g/mol or more, for example, about 55,000 g/mol or more, about 60,000 g/mol or more, about 65,000 g/mol or more, about 70,000 g/mol or more, about 75,0000 g/mol or more, about 80,000 g/mol or more, about 85,000 g/mol or more, about 90,000 g/mol or more, about 95,000 g/mol or more, about 100,000 g/mol or more, about 110,000 g/mol or more, about 120,000 g/mol or more, about 130,000 g/mol or more, about 140,000 g/mol or more, or about 150,000 g/mol or more. Alternatively, or in addition, the sulfonic acid polymer or copolymer can have an average molecular weight of about 200,000 g/mol or less, for example, about 195,000 g/mol or less, about 190,000 g/mol or less, about 185,000 g/mol or less, about 180,000 g/mol or less, about 175,000 g/mol or less, about 170,000 g/mol or less, about 165,000 g/mol or less, about 160,000 g/mol or less, about 155,000 g/mol or less, or about 150,000 g/mol or less. Thus, the sulfonic acid polymer or copolymer can have an average molecular weight bounded by any two of the aforementioned endpoints. For example, the sulfonic acid polymer or copolymer can have an average molecular weight of about 50,000 g/mol to about 200,000 g/mol, about 60,000 g/mol to about 200,000 g/mol, about 70,000 g/mol to about 200,000 g/mol, about 75,000 g/mol to about 200,000 g/mol, about 80,000 g/mol to about 200,000 g/mol, about 90,000 g/mol to about 200,000 g/mol, about 100,000 g/mol to about 200,000 g/mol, about 50,000 g/mol to about 190,000 g/mol, about 50,000 g/mol to about 180,000 g/mol, about 50,000 g/mol to about 170,000 g/mol, about 50,000 g/mol to about 160,000 g/mol, about 50,000 g/mol to about 150,000 g/mol, or about 75,000 g/mol to about 150,000 g/mol.

The polishing composition comprises any suitable amount of the sulfonic acid polymer or copolymer. The amount of sulfonic acid polymer or copolymer refers to the total amount of sulfonic acid polymer or copolymer present in the polishing composition. The polishing composition can comprise about 1 ppm or more of the sulfonic acid polymer or copolymer, for example, about 5 ppm or more, about 10 ppm or more, about 20 ppm or more, about 30 ppm or more, about 40 ppm or more, or about 50 ppm or more. Alternatively, or in addition, the polishing composition can comprise about 500 ppm or less of the sulfonic acid polymer or copolymer, for example, about 450 ppm or less, about 400 ppm or less, about 350 ppm or less, about 300 ppm or less, about 250 ppm or less, about 200 ppm or less, about 150 ppm or less, or about 100 ppm or less. Thus, the polishing composition can comprise the sulfonic acid polymer or copolymer in an amount bounded by any two of the aforementioned endpoints. For example, the polishing composition can comprise about 1 ppm to about 500 ppm of the sulfonic acid polymer or copolymer, about 5 ppm to about 450 ppm, about 10 ppm to about 400 ppm, about 10 ppm to about 350 ppm, about 10 ppm to about 300 ppm, about 10 ppm to about 250 ppm, about 10 ppm to about 200 ppm, about 20 ppm to about 300 ppm, about 20 ppm to about 250 ppm, about 20 ppm to about 200 ppm, about 20 ppm to about 150 ppm, about 20 ppm to about 100 ppm, about 10 ppm to about 100 ppm, about 10 ppm to about 90 ppm, about 10 ppm to about 80 ppm, about 10 ppm to about 70 ppm, about 10 ppm to about 60 ppm, about 10 ppm to about 50 ppm, or about 10 ppm to about 40 ppm.

In certain embodiments, the polishing composition further comprises an oxidizing agent. The oxidizing agent can be any suitable oxidizing agent. Desirably, the oxidizing agent increases the removal rate of silicon carbide when used to polish a substrate comprising the same. A non-limiting example of a suitable oxidizing agent is hydrogen peroxide.

The polishing composition can comprise any suitable amount of the oxidizing agent. For example, the polishing composition can comprise about 0.1 wt. % to about 5 wt. % of the oxidizing agent (e.g., about 0.5 wt. % to about 3 wt. % of the oxidizing agent).

The polishing composition comprises water. The water can be any suitable water and can be, for example, deionized water or distilled water. In some embodiments, the polishing composition can further comprise one or more organic solvents in combination with the water. For example, the polishing composition can further comprise a hydroxylic solvent such as methanol or ethanol, a ketonic solvent, an amide solvent, a sulfoxide solvent, and the like. Preferably, the polishing composition comprises pure water.

The polishing composition has a pH of about 2 to about 5. Thus, the polishing composition can have a pH of about 2 or more, e.g., about 2.2 or more, about 2.4 or more, about 2.6 or more, about 2.8 or more, about 3.0 or more, about 3.2 or more, or about 3.4 or more. Alternatively, or in addition, the polishing composition can have a pH of about 5 or less, e.g., about 4.8 or less, about 4.6 or less, about 4.4 or less, about 4.2 or less, or about 4.0 or less. Thus, the polishing composition can have a pH bounded by any two of the aforementioned endpoints. For example the polishing composition can have a pH of about 2 to about 5, e.g., about 2.2 to about 5, about 2.2 to about 4.8, about 2.4 to about 4.8, about 2.4 to about 4.6, about 2.4 to about 4.4, about 2.4 to about 4.2, or about 2.6 to about 4.0.

The pH of the polishing composition can be adjusted using any suitable acid or base. Non-limiting examples of suitable acids include nitric acid, sulfuric acid, phosphoric acid, and organic acids such as formic acid and acetic acid. Non-limiting examples of suitable bases include sodium hydroxide, potassium hydroxide, and ammonium hydroxide.

The polishing composition optionally further comprises a buffering agent. The buffering agent can be any suitable buffering agent capable of maintaining the polishing composition at a pH as recited herein. Non-limiting examples of suitable buffering agents include formic acid, malonic acid, acetic acid, oxalic acid, citric acid, and phosphoric acid.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 ppm to about 500 ppm, preferably about 10 ppm to about 125 ppm.

In certain embodiments, the polishing composition does not contain a piperazine compound, a 4-morpholine compound, an amino sulfonic acid compound, a substituted amine compound, a tertiary amine compound, or a bis-amine compound, or salts thereof. As used herein, the phrase "does not contain" means that the polishing composition includes no more than trace contaminant amounts of the recited compounds, which amounts are insufficient to affect any SiC, SiN, or SiO removal rates obtainable with the polishing composition during polishing. In certain embodiments, the polishing composition does not contain a substituted 4-morpholine derivative such as 3-(N-morpholino)propanesulfonic acid (MOPS), 4-morpholineethanesulfonic acid (MES), β-hydroxy-4-morpholinepropanesulfonic acid (MOPSO), and combinations thereof. In certain embodiments, the polishing composition does not contain an amino sulfonic acid such as 2-[(2-hydroxy-1,1-bis(hydroxymethyl)ethyl)amino]ethanesulfonic acid (TES), N-[tris(hydroxymethyl)methyl]-3-aminopropanesulfonic acid (TAPS), N-tris(hydroxymethyl)methyl-4-aminobutanesulfonic acid (TABS), N-(2-acetamido)-2-aminoethanesulfonic acid (ACES), N,N-bis(2-hydroxyethyl)-2-aminoethanesulfonic acid (BES), 3-(cyclohexylamino)-1-propanesulfonic acid (CAPS), 2-(cyclohexylamino)ethanesulfonic acid (CHES), and combinations thereof. In certain embodiments, the polishing composition does not contain a substituted amine compound such as 2-hydroxy-3-[tris(hydroxymethyl)methylamino]-1-propanesulfonic acid (TAPSO), N-[tris(hydroxymethyl)methyl]glycine (TRICINE), N,N-bis(2-hydroxyethyl)glycine (BICINE), N-(2-acetamido)iminodiacetic acid (ADA), 2,2-bis(hydroxymethyl)-2,2',2"-nitrilotriethanol (BIS-TRIS), 3-(cyclohexylamino)-2-hydroxy-1-propanesulfonic acid (CAPSO), 3-(N,N-bis[2-hydroxyethyl]amino)-2-hydroxypropanesulfonic acid (DIPSO), and combinations thereof. In certain embodiments, the polishing composition does not contain a substituted bis-amine compound such as 1,3-bis[tris(hydroxymethyl)methylamino]propane (BIS-TRIS PROPANE).

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica particles, sulfonic acid polymer or copolymer, optional buffering agent, optional oxidizing agent, optional pH adjustor, etc.) as well as any combination of ingredients (e.g., silica particles, sulfonic acid polymer or copolymer, optional buffering agent, optional oxidizing agent, optional pH adjustor, etc.).

For example, the silica particles can be dispersed in water. The sulfonic acid polymer or copolymer, optional buffering agent, and optional oxidizing agent can then be added and mixed by any method that is capable of incorporating the components into the polishing composition. The oxidizing agent can be added at any time during the preparation of the polishing composition. The polishing composition can be prepared prior to use, with one or more components, such as the oxidizing agent, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising silica particles, sulfonic acid polymer or copolymer, optional buffering agent, optional oxidizing agent, optional pH adjustor, and water. Alternatively, the silica particles can be supplied as a dispersion in water in a first container, and the sulfonic acid polymer or copolymer, optional buffering agent, optional oxidizing agent, and optional pH adjustor can be supplied in a second container, either in dry form, or as a solution or dispersion in water. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the silica particles, sulfonic acid polymer or copolymer, optional buffering agent, optional pH adjustor, with or without the optional oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the silica particles, sulfonic acid polymer or copolymer, optional buffering agent, and optional pH adjustor can each be present in the concentration in an amount that is about 2 times (e.g., about 3 times, about 4 times, or about 5 times) greater than the concentration recited above for each component so that, when the concentrate is diluted with an equal volume of water (e.g., 2 equal volumes of water, 3 equal volumes of water, or 4 equal volumes of water, respectively), along with the optional oxidizing agent in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically mechanically polishing a substrate comprising (i) providing a substrate, wherein the substrate comprises a silicon carbide layer on a surface of the substrate; (ii) providing a polishing pad; (iii) providing a polishing composition comprising (a) silica particles, (b) a polymer comprising sulfonic acid monomeric units, and (c) water, wherein the polishing composition has a pH of about 2 to about 5; (iv) contacting the substrate with the polishing pad and the polishing composition; and (v) moving the polishing pad and the polishing composition relative to the substrate to abrade at least a portion of the silicon carbide layer on a surface of the substrate to polish the substrate.

The chemical-mechanical polishing composition can be used to polish any suitable substrate and is especially useful for polishing substrates comprising at least one layer (typically a surface layer) comprised of silicon carbide. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon carbide, silicon nitride, and/or silicon oxide, e.g., any one, two, or especially all three of the aforementioned materials. In a preferred embodiment, the chemical-mechanical polishing composition can be used to polish a substrate comprising a silicon carbide layer on a surface of the substrate.

In certain embodiments, the substrate comprises silicon carbide in combination with silicon nitride and/or silicon oxide. The silicon carbide can be any suitable silicon carbide, many forms of which are known in the art. The silicon carbide can have any suitable polytype. The silicon nitride can be any suitable silicon nitride. The silicon oxide similarly can be any suitable silicon oxide, many forms of which are known in the art. Suitable types of silicon oxide include, but are not limited to, TEOS, borophosphosilicate glass (BPSG), PETEOS, thermal oxide, undoped silicate glass, and HDP oxide.

The chemical-mechanical polishing composition of the invention desirably exhibits a high removal rate when polishing a substrate comprising silicon carbide according to a method of the invention. For example, when polishing silicon wafers comprising silicon carbide in accordance with an embodiment of the invention, the polishing composition desirably exhibits a silicon carbide removal rate of about 500 Å/min or higher, about 700 Å/min or higher, about 800 Å/min or higher, about 900 Å/min or higher, about 1,000 Å/min or higher, about 1,100 Å/min or higher, about 1,250 Å/min or higher, about 1,500 Å/min or higher, about 1,750 Å/min or higher, or about 2,000 Å/min or higher.

The chemical-mechanical polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a removal rate of the silicon nitride of about 200 Å/min or lower, for example, about 150 Å/min or lower, about 100 Å/min or lower, about 90 Å/min or lower, about 80 Å/min or lower, about 70 Å/min or lower, about 60 Å/min or lower, about 50 Å/min or lower, about 40 Å/min or lower, or even about 30 Å/min or lower. Thus, when used to polish a substrate comprising a silicon carbide layer and a silicon nitride layer, the polishing composition desirably exhibits selectivity for the polishing of the silicon carbide layer over the silicon nitride layer. Selectivity for the polishing of a first material over a second material can be defined as the ratio of removal rates of the first material and the second material. When the removal rate of the first material is greater than the removal rate of the second material, the polishing composition can be considered to exhibit selectivity for the removal of the first material.

The chemical-mechanical polishing composition of the invention desirably exhibits a low removal rate when polishing a substrate comprising silicon oxide according to a method of the invention. For example, when polishing silicon wafers comprising silicon oxide in accordance with an embodiment of the invention, such as high density plasma (HDP) oxides, plasma-enhanced tetraethyl orthosilicate (PETEOS), and/or tetraethyl orthosilicate (TEOS), the polishing composition desirably exhibits a removal rate of the silicon oxide of about 200 Å/min or lower, for example, about 150 Å/min or lower, about 100 Å/min or lower, about 90 Å/min or lower, about 80 Å/min or lower, about 70 Å/min or lower, about 60 Å/min or lower, about 50 Å/min or lower, about 40 Å/min or lower, or even about 30 Å/min or lower. Thus, when used to polish a substrate comprising a silicon carbide layer and a silicon oxide layer, the polishing composition desirably exhibits selectivity for the polishing of the silicon carbide layer over the silicon oxide layer.

The chemical-mechanical polishing composition of the invention can be tailored to provide effective polishing at the desired polishing ranges selective to specific thin layer materials, while at the same time minimizing surface imperfections, defects, corrosion, erosion, and the removal of stop layers. The selectivity can be controlled, to some extent, by altering the relative concentrations of the components of the polishing composition. When desirable, the chemical-mechanical polishing composition of the invention can be used to polish a substrate with a silicon carbide to silicon nitride polishing selectivity of about 5:1 or higher (e.g., about 10:1 or higher, about 15:1 or higher, about 25:1 or higher, about 50:1 or higher, about 100:1 or higher, or about 150:1 or higher). Also, the chemical-mechanical polishing composition of the invention can be used to polish a substrate with a silicon carbide to silicon oxide polishing selectivity of about 5:1 or higher (e.g., about 10:1 or higher, about 15:1 or higher, about 25:1 or higher, about 50:1 or higher, about 100:1 or higher, or about 150:1 or higher). Thus, in embodiments, when used to polish substrates comprising at least one layer of silicon carbide and at least one layer of silicon nitride and/or at least one layer of silicon oxide, the polishing composition and polishing method allow for the preferential removal of silicon carbide as compared with the removal of silicon nitride and/or silicon oxide.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of a surface of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFINT™ SSW1, SPM3100 (commercially available from, for example, Eminess Technologies), POLITEX™, and Fujibo POLYPAS™ 27 (Fujibo H7000, H800, H600, H804 etc. not sure if these examples are really needed).

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

Example 1

This example compares the removal rates of silicon carbide (SiC) and silicon nitride (SiN) exhibited by polishing compositions comprising silica particles containing aluminum ions and sulfonic acid polymers or copolymers.

Separate substrates comprising blanket layers of SiC and SiN were polished with nine different polishing compositions, i.e., Polishing Compositions 1A-1I. Each of Polishing Compositions 1A-1I comprised 1.0 wt. % of Nalco TX13573 silica, 120 ppm of a buffering agent, 2 wt. % of hydrogen peroxide, and 15 ppm Kordek™ biocide (Dow Chemical, Midland, Mich.) in water at a pH of 3.5. Polishing Compositions 1A-1I also included a sulfonic acid polymer or copolymer and buffering agent set forth in Table 1.

TABLE 1

Components of Polishing Compositions 1A-1I

| Polishing Composition | Sulfonic Acid Polymer Or Copolymer | Amount of Sulfonic Acid Polymer Or Copolymer | Buffering Agent |
|---|---|---|---|
| 1A | None | 0 | Formic Acid |
| 1B | Poly(4-styrenesulfonic acid) (MW 75,000) | 25 ppm | Formic acid |
| 1C | Poly(4-styrenesulfonic acid-co-maleic acid), sodium salt (3:1) | 25 ppm | Formic acid |
| 1D | Poly(4-styrenesulfonic acid-co-maleic acid), sodium salt (1:1) (MW 15,000) | 25 ppm | Formic acid |
| 1E | Poly(4-styrenesulfonic acid), ammonium salt (MW 200,000) | 25 ppm | Formic acid |
| 1F | Poly(4-styrenesulfonic acid-co-maleic acid), sodium salt (1:1) (MW 20,000) | 25 ppm | Formic acid |
| 1G | Poly(2-acrylamide-2-methylpropanesulfonic acid) | 25 ppm | Formic acid |
| 1H | Dioctylsulfosuccinate | 25 ppm | Formic acid |
| 1I | Dioctylsulfosuccinate | 250 ppm | Formic acid |

Following polishing, the removal rates were determined, and the results are set forth in Table 2.

TABLE 2

| Removal Rates of SiC and SiN as a Function of Type of Sulfonic Acid Polymer or Copolymer | | | |
|---|---|---|---|
| Polishing Composition | SiC Removal Rate (Å/min) | SiN Removal Rate (Å/min) | SiC/SiN Selectivity |
| 1A (control) | 1138 | 729 | 1.6 |
| 1B (inventive) | 1062 | 48 | 22.1 |
| 1C (inventive) | 1046 | 208 | 5.0 |
| 1D (inventive) | 706 | 35 | 20.2 |
| 1E (inventive) | 1100 | 34 | 32.4 |
| 1F (inventive) | 953 | 42 | 22.7 |
| 1G (inventive) | 1082 | 67 | 16.1 |
| 1H (comparative) | 889 | 775 | 1.1 |
| 1I (comparative) | 158 | 30 | 5.3 |

As is apparent from the results set forth in Table 2, inventive Polishing Compositions 1B-1G desirably exhibited good SiC removal rates and SiC/SiN selectivities of approximately 5.0 to 32.4. The selectivities are calculated by determining the ratio of SiC to SiN removal rates. Polishing Composition 1H, which contained dioctylsulfosuccinate, exhibited a lower SiC removal rate and a lower SiC/SiN selectivity than control Polishing Composition 1A. Increasing the amount of dioctylsulfosuccinate in comparative Polishing Composition 1I to 250 ppm (i.e., increasing the amount of a monomeric sulfonic acid) improved the SiC/SiN selectivity as compared to comparative Polishing Composition 1H, but significantly reduced the SiC removal rate as well.

Example 2

This example demonstrates the effect of the amount of polystyrenesulfonic acid (i.e., a sulfonic acid polymer) on SiC, SiN, and silicon oxide (SiO) removal rates exhibited by polishing compositions comprising silica particles containing aluminum ions and hydrogen peroxide.

Separate substrates comprising blanket layers of SiC, SiN and SiO were polished with five different polishing compositions, i.e., Polishing Compositions 2A-2E. Each of Polishing Compositions 2A-2E comprised 1.0 wt. % of Nalco TX13573 silica, 120 ppm of a formic acid (i.e., a buffering agent), 2 wt. % of hydrogen peroxide, and 15 ppm Kordek™ biocide in water at a pH of 3.5. Polishing Compositions 2B-2E also contained polystyrenesulfonic acid (PSA) in the amounts set forth in Table 3.

Following polishing, the removal rates of SiC, SiN and SiO were determined, and the results are set forth in Table 3.

TABLE 3

| Removal Rates of SiC, SiO, and SiN as a Function of Polystyrenesulfonic Acid (PSA) Concentration | | | | | |
|---|---|---|---|---|---|
| Polishing Composition | PSA Concentration (ppm) | SiC Removal Rate (Å/min) | SiO Removal Rate (Å/min) | SiN Removal Rate (Å/min) | SiC/SiN Selectivity |
| 2A (control) | 0 | 1138 | 86 | 729 | 1.6 |
| 2B (inventive) | 5 | 1076 | 100 | 378 | 2.8 |
| 2C (inventive) | 15 | 1057 | 107 | 64 | 16.5 |
| 2D (inventive) | 25 | 1062 | 104 | 48 | 22.1 |
| 2E (inventive) | 35 | 813 | 77 | 14 | 58.1 |

As is apparent from the results set forth in Table 3, the addition of polystyrenesulfonic acid to Polishing Compositions 2B-2E had little effect on the removal rate of SiO. Increasing the concentration of polystyrenesulfonic acid from 0 ppm to 25 ppm resulted in an increase in the SiC/SiN selectivity from approximately 1.6 to approximately 22.1, while the SiC removal rate decreased approximately 6.7%. Increasing the concentration of polystyrenesulfonic acid to 35 ppm resulted in a SiC/SiN selectivity of approximately 58.1, but a reduction in the SiC removal rate of approximately 71.4% the removal rate exhibited by control Polishing Composition 2A, which did not comprise any polystyrenesulfonic acid. Thus, the presence of 5-35 ppm of polystyrenesulfonic acid resulted in a desirable increase in the SiC/SiN selectivity while maintaining good SiC removal rates. When the amount of polystyrenesulfonic acid was increased to 35 ppm, the SiC/SiN selectivity increased, but the SiC removal rate decreased.

Example 3

This example demonstrates the effect of pH on SiC, SiN, and SiO removal rates exhibited by polishing compositions comprising silica particles containing aluminum ions and sulfonic acid polymers or copolymers.

Separate substrates comprising blanket layers of SiC, SiN and SiO were polished with seven different polishing compositions, i.e., Polishing Compositions 3A-3G. Each of Polishing Compositions 3A-3G comprised 1.0 wt. % of Nalco TX13573 silica, 25 ppm of polystyrenesulfonic acid (i.e., a sulfonic acid polymer), 120 ppm of formic acid (i.e., a buffering agent), 2 wt. % of hydrogen peroxide, and 15 ppm Kordek™ biocide in water. The pH values of Polishing Compositions 3A-3G are reported in Table 4.

Following polishing, the removal rates of SiC, SiN and SiO were determined, and the results are set forth in Table 4.

TABLE 4

| Removal Rates of SiC, SiO, and SiN as a Function of Polishing Composition pH | | | | | | |
|---|---|---|---|---|---|---|
| Polishing Composition | pH | SiC Removal Rate (Å/min) | SiO Removal Rate (Å/min) | SiN Removal Rate (Å/min) | SiC/SiN Selectivity | SiC/SiO Selectivity |
| 3A (inventive) | 2.5 | 1117 | 293 | 46 | 24.3 | 3.8 |
| 3B (inventive) | 3.0 | 966 | 128 | 40 | 24.2 | 7.5 |
| 3C (inventive) | 3.5 | 819 | 92 | 27 | 30.3 | 8.9 |
| 3D (inventive) | 4.0 | 1077 | 78 | 25 | 43.1 | 13.8 |
| 3E (inventive) | 4.5 | 1129 | 76 | 24 | 47.0 | 14.9 |
| 3F (inventive) | 5.0 | 1071 | 80 | 25 | 42.8 | 13.4 |
| 3G (comparative) | 6.0 | 487 | 81 | 27 | 18.0 | 6.0 |

As is apparent from the results set forth in Table 4, the SiC removal rate remained high from pH 2.5 to pH 5.0, but the SiC removal rate at pH 6.0 was approximately 45% of the removal rate at pH 5.0. The SiC/SiN selectivity ranged from 24.3 at pH 2.5 to 47.0 at pH 4.5, but was 18.0 at pH 6.0. The SiC/SiO selectivity increased from 3.8 at pH 2.5 to 7.5 at pH 3.0 and decreased from 13.4 at pH 5.0 to 6.0 at pH 6.0. Thus, in these embodiments, the SiC/SiN selectivity was optimized in a pH range of 3.0 and 5.0. At a pH value of 2.5, the SiO removal rate was more than twice the removal rate observed at a pH value of 3.0. At a pH value of 6.0, the SiN removal rate was less than half the SiN removal rate observed at a pH of 5.0.

Example 4

This example demonstrates the effect of silica particles on the SiC, SiN, and SiO removal rates exhibited by polishing compositions further comprising sulfonic acid polymers or copolymers and a buffering agent.

Separate substrates comprising blanket layers of SiC, SiN and SiO were polished with seven different polishing compositions, i.e., Polishing Compositions 4A-4G. Each of Polishing Compositions 4A-4G comprised 25 ppm of polystyrenesulfonic acid (i.e., a sulfonic acid polymer), 120 ppm of formic acid (i.e., a buffering agent), 2 wt. % of hydrogen peroxide, and 15 ppm Kordek™ biocide in water at a pH of 3.5. Each of Polishing Compositions 4A-4G further comprised 1.0 wt. % of the type of silica listed in Table 5. CMC WL-83A is a colloidal silica particle that has been surface modified with aluminum ions, as described in U.S Published Application 2016/0222254.

Following polishing, the removal rates of SiC, SiN and SiO were determined, and the results are set forth in Table 5.

TABLE 5

Removal Rates of SiC, SiN and SiO as a Function of Silica Particles

| Polishing Composition | Silica Particles | SiC Removal Rate (Å/min) | SiN Removal Rate (Å/min) | SiO Removal Rate (Å/min) | SiC/SiN Selectivity | SiC/SiO Selectivity |
|---|---|---|---|---|---|---|
| 4A (inventive) | Nalco TX13573 | 1002 | 62 | 25 | 16.2 | 40.1 |
| 4B (inventive) | Nissan ST-OYL | 863 | 254 | 70 | 3.4 | 12.3 |
| 4C (inventive) | Fuso PL-3D | 666 | 168 | 29 | 4.0 | 23.0 |
| 4D (inventive) | CMC WL-83A | 1048 | 137 | 12 | 7.6 | 87.3 |
| 4E (inventive) | Nissan ST-OL-40 | 631 | 124 | 38 | 5.1 | 16.6 |
| 4F (inventive) | Nissan ST-OZL-35 | 1264 | 216 | 73 | 5.9 | 17.3 |
| 4G (inventive) | Nissan ST-PSMO | 927 | 183 | 7 | 5.1 | 132.4 |

As is apparent from the results set forth in Table 5, Polishing Composition 4A, which contained Nalco TX13573 silica particles, exhibited the highest SiC/SiN selectivity. Polishing Composition 4F, which contained Nissan ST-OZL-35 silica particles, exhibited the highest SiC removal rate. Polishing Composition 4G, which contained the Nissan ST-PSMO silica, exhibited the highest SiC/SiO selectivity. These results demonstrate that removal rates of SiC, SiN, and SiO and the SiC/SiN and SiC/SiO selectivities can be tailored through the use of particular silica particles.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically mechanically polishing a substrate comprising:

(i) providing a substrate, wherein the substrate comprises a silicon carbide layer on a surface of the substrate;

(ii) providing a polishing pad;

(iii) providing a polishing composition comprising:

(a) silica particles, (b) a polymer comprising sulfonic acid monomeric units selected from polystyrenesulfonic acid, poly(2-acrylamido-2-methyl-1-propanesulfonic acid), and poly(styrenesulfonic acid-co-maleic acid), and has an average molecular weight of about 75,000 g/mole to about 200,000 g/mole, and (c) water, wherein the polishing composition has a pH of about 2 to about 5;

(iv) contacting the substrate with the polishing pad and the polishing composition; and (v) moving the polishing pad and the polishing composition relative to the substrate to abrade at least a portion of the silicon carbide layer on a surface of the substrate to polish the substrate.

2. The method of claim 1, wherein the silica particles comprise aluminum ions, and wherein the aluminum ions are uniformly distributed within the silica particles.

3. The method of claim 1, wherein the silica particles have an average particle size of about 40 nm to about 60 nm.

4. The method of claim 1, wherein the polymer comprising sulfonic acid monomeric units is polystyrenesulfonic acid.

5. The method of claim 1, wherein the polishing composition further comprises an oxidizing agent.

6. The method of claim 1, wherein the polishing composition further comprises a buffering agent.

7. The method of claim 1, wherein the substrate further comprises a silicon nitride layer on a surface of the substrate, and wherein at least a portion of the silicon nitride layer on a surface of the substrate is abraded to polish the substrate, wherein the polishing composition exhibits selectivity for the polishing of the silicon carbide layer over the silicon nitride layer.

8. The method of claim 1, wherein the substrate further comprises a silicon oxide layer on a surface of the substrate, and wherein at least a portion of the silicon oxide layer on a surface of the substrate is abraded to polish the substrate, wherein the polishing composition exhibits selectivity for the polishing of the silicon carbide layer over the silicon oxide layer.

* * * * *